United States Patent [19]

Byram

[11] Patent Number: 4,492,923
[45] Date of Patent: Jan. 8, 1985

[54] APPARATUS FOR MEASURING THE SPATIAL SCALAR VARIATION OF A MAGNETIC FIELD WITH VECTOR MAGNETIC SENSORS ON A MODERATELY STABLY MOVING PLATFORM

[75] Inventor: George W. Byram, San Diego, Calif.

[73] Assignee: The United States of America as represented by the Secretary of the Navy, Washington, D.C.

[21] Appl. No.: 390,461

[22] Filed: Jun. 21, 1982

[51] Int. Cl.³ .................. G01B 7/14; G01R 33/02
[52] U.S. Cl. ................................ 324/207; 324/247
[58] Field of Search ............ 324/207, 208, 244, 247, 324/262, 245, 246, 248, 345, 331, 346

[56] References Cited

U.S. PATENT DOCUMENTS

| | | | |
|---|---|---|---|
| 2,438,964 | 4/1948 | Cunningham et al. | 175/183 |
| 2,485,931 | 10/1949 | Slonczewski | 324/247 |
| 3,061,239 | 10/1962 | Rusk | 244/1 |
| 3,398,360 | 8/1968 | Behr et al. | 324/43 |
| 3,644,825 | 2/1972 | Davis, Jr. et al. | 324/41 |
| 3,667,033 | 5/1972 | Davis | 324/43 R |
| 3,750,017 | 7/1973 | Bowman et al. | 324/72 |
| 3,936,949 | 2/1976 | Devaud | 33/352 |
| 3,942,258 | 3/1976 | Stucki et al. | 33/361 |
| 4,054,881 | 10/1977 | Raab | 324/244 X |

Primary Examiner—Gerard R. Strecker
Assistant Examiner—Walter E. Snow
Attorney, Agent, or Firm—Robert F. Beers; Ervin F. Johnston; Edmund W. Rusche, Jr.

[57] ABSTRACT

An apparatus, using three gradiometers, measures the spatial variation of a magnetic field along a path of motion of the apparatus. The apparatus comprises three gradiometers oriented along the mutually orthogonal axes, x', y' and z' defined on the moving platform. The outputs of the gradiometers are the gradients of the magnetic field when the motion is considered to be in the y' direction. Three filters, each having an input connected to the output of one of the gradiometers, are constructed to have an output signal which has a relatively narrow positive peak with a relatively wide negative area on each side of the peak. The net area is approximately zero when the input to the filter is a doublet. Three squares, each having an input connected to the output of a filter, square their input signals. A summer, having three inputs connected to the outputs of the squarers, obtains the sum of the squares of the high-pass filtered components x', y' and z' of the magnetic field. A circuit, whose input is connected to the output of the summer, takes the square root of its input signal and outputs a signal corresponding to the magnitude of the variation of magnetic field along the path of motion of the platform.

7 Claims, 10 Drawing Figures

PLATFORM MOVING IN y' DIRECTION.
y' IS APPROXIMATELY ALINED WITH y.

TYPICAL SYSTEM STRUCTURE.

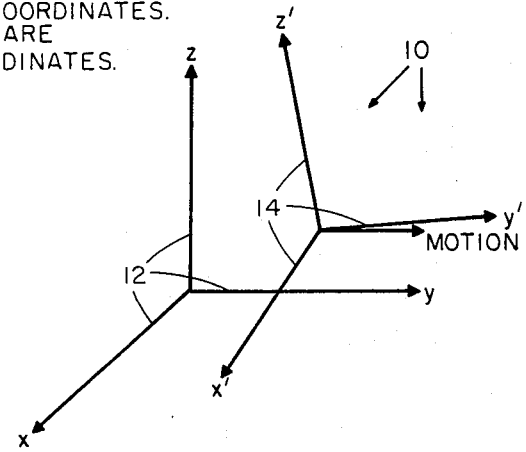
FIG. 1 TWO COORDINATE FRAMES, EACH ORTHOGONAL.
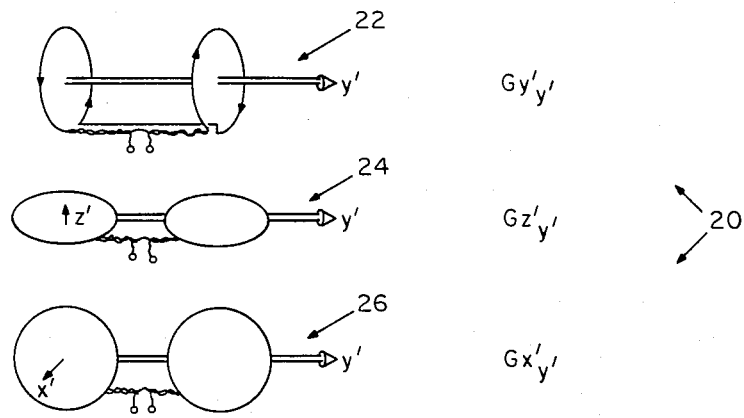
FIG. 2 GRADIOMETER SENSE COIL CONFIGURATIONS.
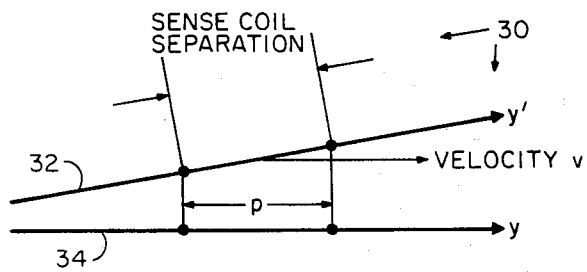
FIG. 3A PROJECTION OF THE GRADIOMETER SEPARATION ON THE DIRECTION OF MOTION.

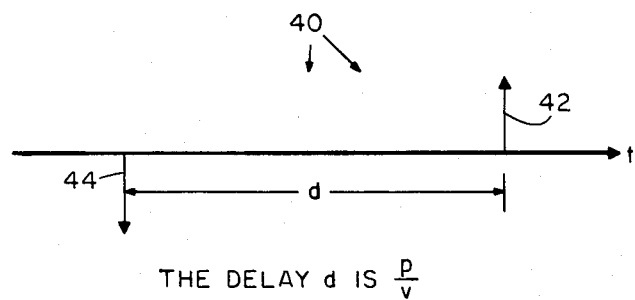
THE DELAY d IS $\frac{p}{v}$
FIG.3B EQUIVALENT DIPOLE EFFECT.
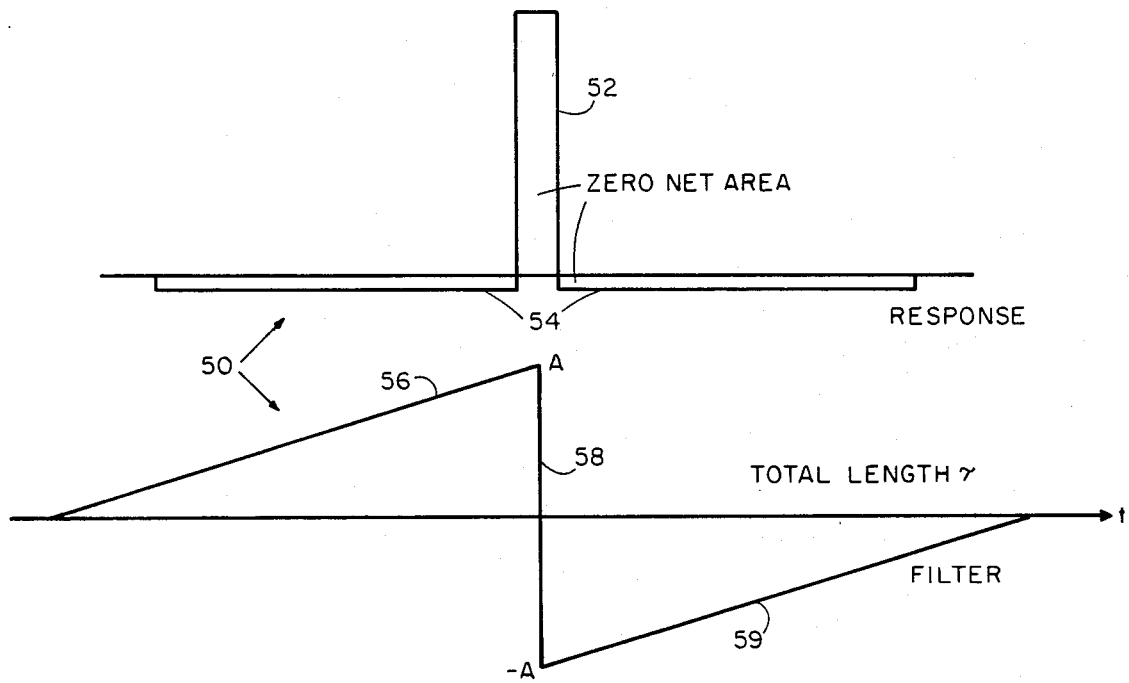
FIG.4 TYPICAL DESIRABLE SYSTEM RESPONSE FUNCTION AND THE CORRESPONDING FILTER.
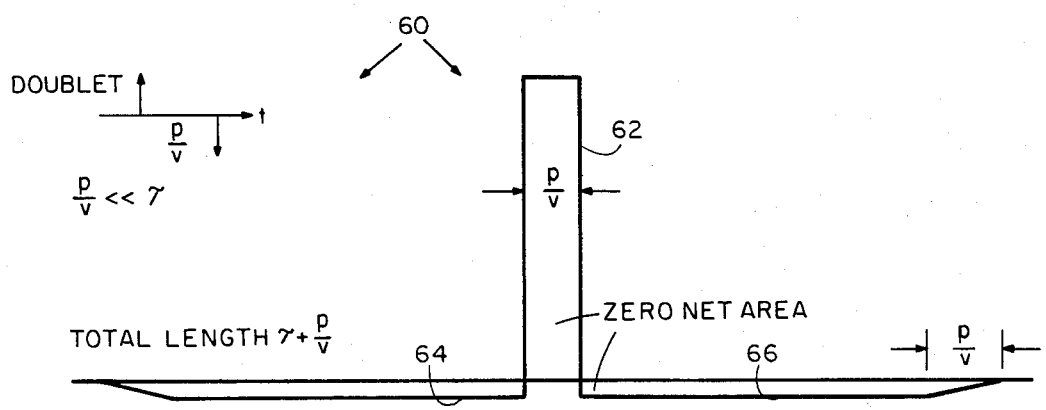
FIG.5 DEPENDENCE OF RESPONSE FUNCTION ON PROJECTED GRADIOMETER AREA.

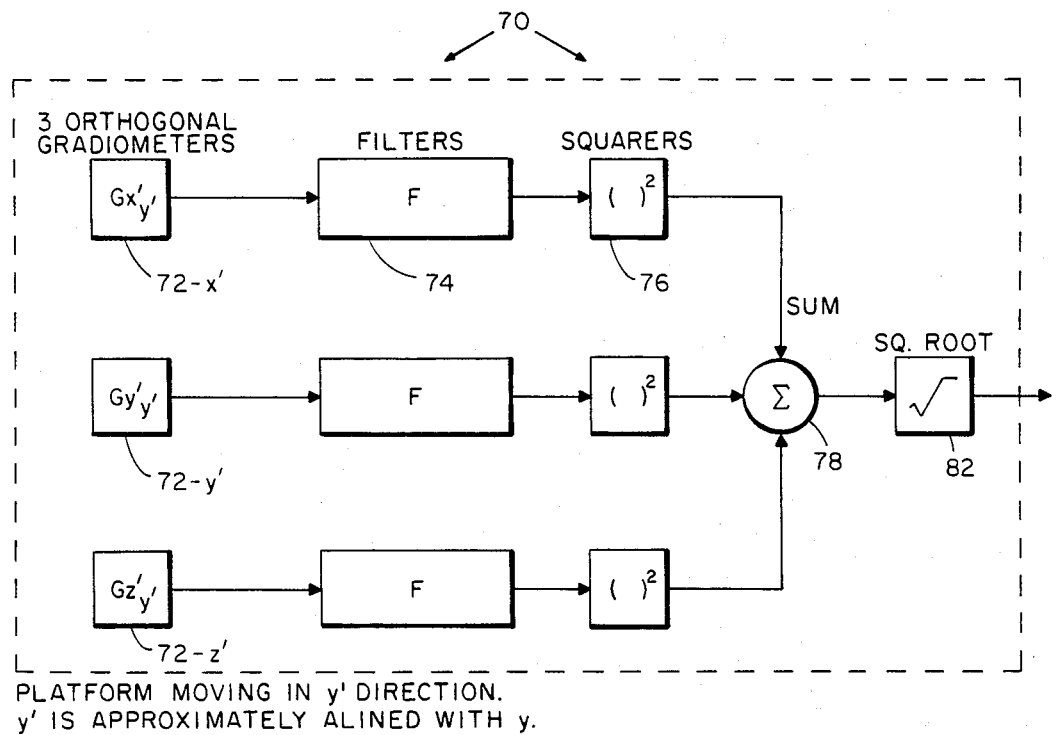
PLATFORM MOVING IN y' DIRECTION.
y' IS APPROXIMATELY ALINED WITH y.
*FIG.6* TYPICAL SYSTEM STRUCTURE.
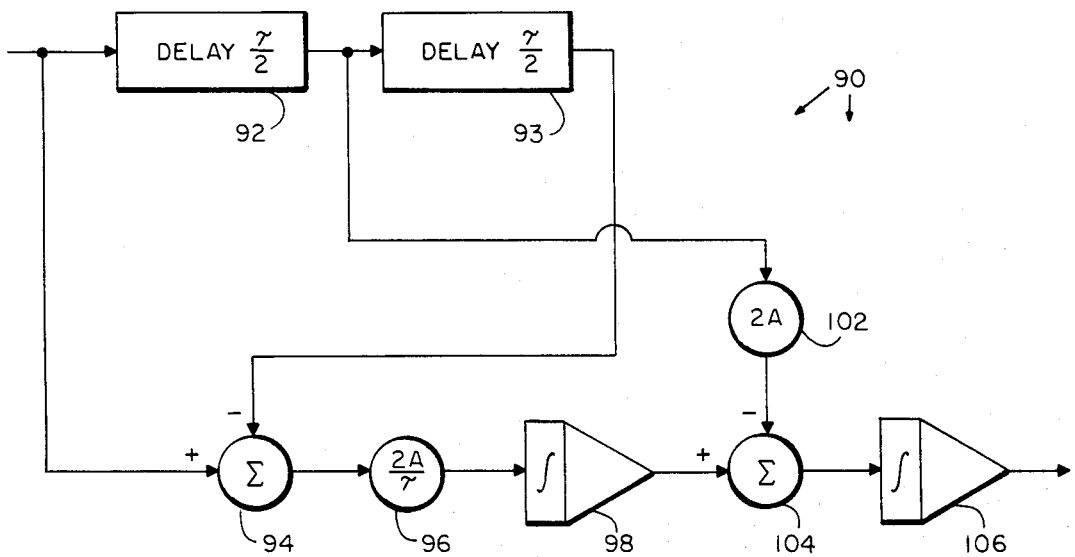
*FIG.7* ONE POSSIBLE IMPLEMENTATION OF FILTER FOR RESPONSE OF FIG.4.

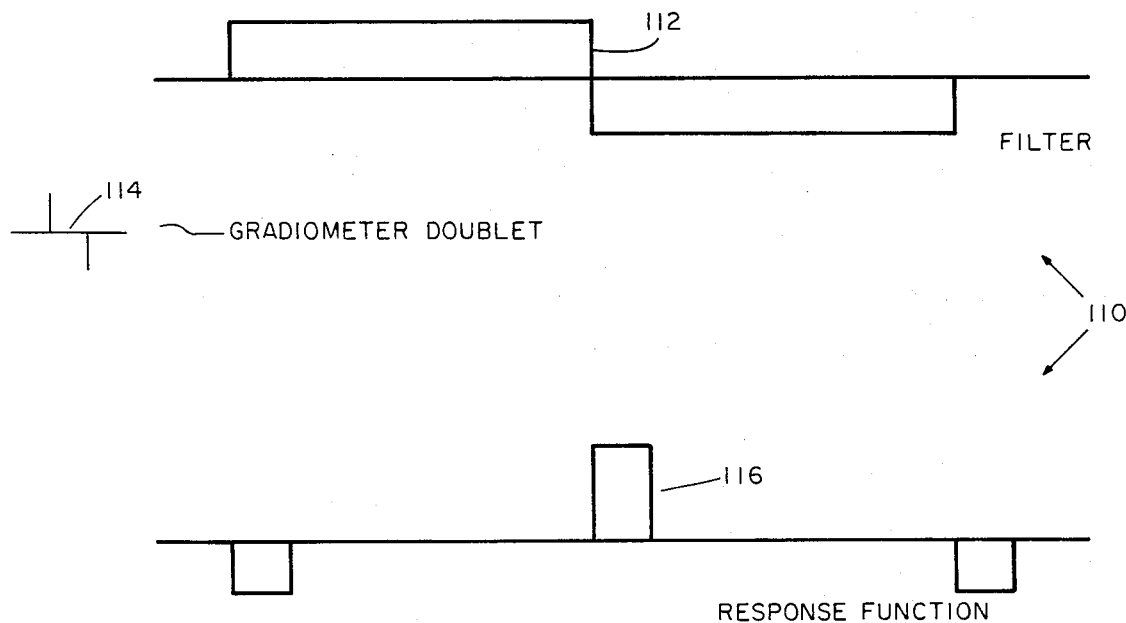
FIG. 8 BASIC BUILDING BLOCK FOR SYMMETRIC RESPONSE FUNCTIONS.
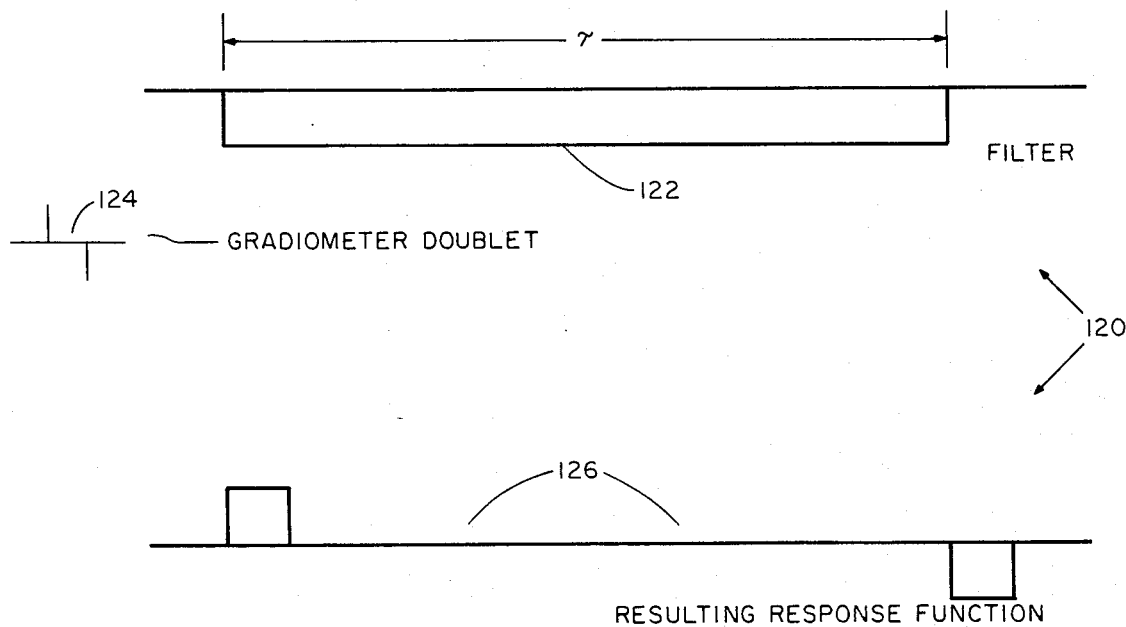
FIG. 9 FILTER TO CONVERT A SHORT BASELINE GRADIOMETER RESPONSE TO A LONGER BASELINE.

4,492,923

APPARATUS FOR MEASURING THE SPATIAL SCALAR VARIATION OF A MAGNETIC FIELD WITH VECTOR MAGNETIC SENSORS ON A MODERATELY STABLE MOVING PLATFORM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to an apparatus for measuring the spatial variation of the magnetic field with signal processing techniques which permit the use of high sensitivity vector magnetometers such as super conducting quantum interference devices (SQUID). The apparatus uses a triad of gradiometers and filters to produce a high-pass filtered estimate of the field variation along the path.

The sensitivity of the instrument to temporal noise components is that of a short baseline gradiometer. The sensitivity function to spatial variation of ambient fields along the path of the platform can be structured into members of a family of desirable response functions. From this, a spatial field variation estimate can be derived which is relatively insensitive to small rotations of the magnetometer coordinate frame with respect to fixed geographic coordinates.

SQUID magnetometers offer much higher sensitivity than conventional magnetometers such as cesium vapor or proton precession instruments. The SQUID, however, is inherently a vector field sensor as compared to devices which sense only the absolute magnitude of the field. This vector property makes the SQUID difficult to use in a strong background field such that of the earth since a slight rotation of the instrument will change the projection of the strong background field on the sensitive axes of the instrument by an amount large compared to the small field variations one may wish to measure. Since the SQUID is by nature an incremental instrument, the output from each sensor contains a large and unknown offset. This precludes simple means of deriving rotation-insensitive spatial field estimates such as, for example, taking the square root of the sum of the squares of the outputs of three orthogonal sensors.

An approach which has been used in the past to reduce the sensitivity of vector magnetometers to noise fields in applications involving the location of ferrous objects utilizes measurements of field component gradients rather than the actual field components. An individual source of magnetic fields will be at least a dipole, and hence its field will decrease with the cube of distance. The gradient will decrease as the fourth power of distance.

For magnetic prospecting and applications involving the location of ferrous objects, the effective distance to disturbing noise sources will usually be large compared to the distance to the sources to be measured. Hence, a more favorable signal-to-noise ratio is obtained in a gradient measurement than in a direct field measurement. This will be particularly beneficial with respect to fluctuating terms due to sensor rotation. The disadvantage of this approach is that the signal field gradient is small with respect to the signal field and, even the ability to use sensitive SQUID magnetometers in forming the gradiometer may not recover this difference. This is the problem which is solved by the present invention.

SUMMARY OF THE INVENTION

This invention relates to a means of deriving an estimate of the spatial variation local magnitude of the magnetic field along the path of a moving platform by processing the outputs of three vector gradiometers to measure the gradients along the direction of platform motion of the vector components of the field. The outputs of the three individual gradiometers are convolutionally filtered by functions which map the time doublet corresponding to the spatial response of a moving gradiometer into a net response having a strong central peak and a broad uniform negative side lobe. This output provides a high-pass filtered estimate of the local value of one vector component of the field.

The filter functions are chosen to have zero net area, hence the constant term corresponding to the intrinsic offset of an incremental magnetometer such as the SQUID will not appear in the filter output. Hence, the square root of the sum of the squares of the filter outputs for gradients along the direction of platform motion for three orthogonal vector components of field provides an estimate of the variation of local field magnitude along the path of the platform.

This permits use of highly sensitive vector magnetometers on a moderately stable moving base in a form that combines the noise rejection of a gradiometer with local sensitivity approaching that of a single magnetometer. If the direction of gradient measurement is kept within ±5° of the direction of motion, residual distortion terms are down by roughly 40 dB from the main estimate. Since this form of measurement estimates the excess of the field that the central peak of its response function has over the average value in the region spanned by the negative side lobes, it provides a high degree of self averaging, which is ideal for the location of ferrous objects and for magnetic prospecting.

OBJECTS OF THE INVENTION

An object of the invention is to provide an apparatus which utilizes vector magnetometers to provide accurate scalar measurements of a magnetic field.

Another object of the invention is to provide an apparatus which has the very favorable signal-to-noise ratio of a gradiometer and yet the apparatus estimates spatial variation of field magnitude along the path it travels.

These and other objects of the invention will become more readily apparent from the ensuing specification when taken together with the drawings.

BRIEF DESCRIPTION OF THE DRAWINGS

FIG. 1 is a pair of coordinates used in the description of the invention, a set of fixed geographic coordinates and a set of moving coordinates.

FIG. 2 is a diagrammatic view of three orthogonal gradiometer sense coil configurations.

FIG. 3 is a pair of graphs, consisting of two parts, FIG. 3A and FIG. 3B; FIG. 3A showing the equivalent response of a moving radiometer to spatial components of the field along the direction of motion, whereas FIG. 3B shows the equivalent dipole effect.

FIG. 4 is a set of graphs showing a typical system response function and the corresponding filter which effectuates the response.

FIG. 5 is a graph showing the dependence of the response function on the projected gradiometer area.

FIG. 6 is a block diagram of a typical system structure.

FIG. 7 is a block diagram showing one possible implementation of the filter used in the apparatus of FIG. 6.

FIG. 8 is a set of three graphs showing the basic building block for symmetric response functions.

FIG. 9 is a set of graphs showing the filter configuration required to convert a short baseline gradiometer response to a longer baseline.

DESCRIPTION OF THE PREFERRED EMBODIMENTS

Before describing the embodiments of the invention, the theory behind the invention will be described in great detail. First, reference is directed to FIG. 1. Therein are shown two orthogonal coordinate frames, 12 and 14. Coordinate frame 12 relates to fixed geographic coordinates, x, y, and z, whereas coordinate frame 14 relates to a set of moving coordinates x', y', and z'. As is shown in the figure, the two coordinate frames, 12 and 14, are approximately but not necessarily exactly aligned.

The sensors are set up as gradiometers in the primed frame moving in the positive y direction with respect to the unprimed frame. The three gradiometer configurations of interest herein are shown in FIG. 2, reference numerals 22, 24, and 26. Each of the gradiometers measures the gradient, $Gy'_{y'}$, $Gz'_{y'}$ and $Gx'_{y'}$, in the y' direction of one component of magnetic field as seen in the primed coordinate frame, 14, in FIG. 1.

To relate these measurements to the components of the field in unprimed coordinates, it is convenient to use the direction cosine matrix, in terms of $\lambda$, $\mu$ and $\nu$:

$$\begin{bmatrix} x' \\ y' \\ z' \end{bmatrix} = \begin{bmatrix} \lambda_1 & \mu_1 & \nu_1 \\ \lambda_2 & \mu_2 & \nu_2 \\ \lambda_3 & \mu_3 & \nu_3 \end{bmatrix} \begin{bmatrix} x \\ y \\ z \end{bmatrix} \quad (1)$$

Equation (1) gives the primed, moving, axes in terms of the unprimed axes.

Reference is now directed to FIG. 2, wherein are shown three orthogonal gradiometer sense coil configurations, 22, 24, and 26. The change in projected area of the sense coils as well as the projections of the axes must be taken into account. If the notation $Ga_b$ is adopted to denote the gradient of a component of the field along the b axis, the outputs of three gradiometers may be written as:

$$Gx'_{y'} = \begin{Bmatrix} Gx_x\lambda_1\lambda_2 + Gx_y\lambda_1\mu_2 + Gx_z\lambda_1\nu_2 + \\ Gy_x\mu_1\lambda_2 + Gy_y\mu_1\mu_2 + Gy_z\mu_1\nu_2 + \\ Gz_x\nu_1\lambda_2 + Gz_y\nu_1\mu_2 + Gz_z\nu_1\nu_2 \end{Bmatrix} \quad (2)$$

$$Gy'_{y'} = \begin{Bmatrix} Gx_x\lambda_2^2 + Gx_y\lambda_2\mu_2 + Gx_z\lambda_2\nu_2 + \\ Gy_x\mu_2\lambda_2 + Gy_y\mu_2^2 + Gy_z\mu_2\nu_2 + \\ Gz_x\nu_2\lambda_2 + Gz_y\mu_2\nu_2 + Gz_z\nu_2^2 \end{Bmatrix} \quad (3)$$

$$Gz'_{y'} = \begin{Bmatrix} Gx_x\lambda_3\lambda_2 + Gx_y\lambda_2\mu_2 + Gx_z\lambda_3\nu_2 + \\ Gy_x\mu_3\lambda_2 + Gy_y\mu_3\mu_2 + Gy_z\mu_3\nu_2 + \\ Gz_x\nu_3\lambda_2 + Gz_y\nu_3\mu_2 + Gz_z\nu_3\nu_2 \end{Bmatrix} \quad (4)$$

An objective of the invention is to measure the spatial variation of magnetic fields along the path y' of the platform carrying the gradiometers. If the output of the gradiometer be considered as a time function, an impulse response to a component of field localized along the path of motion can be defined which will have the form of a doublet whose members are separated by a time interval equal to the projected separation of the sense coils of the gradiometer on the direction of motion, divided by the platform velocity. This is illustrated in FIG. 3. This is the motivation for selection of the configurations shown in FIG. 2.

For these particular measurements the outputs of the gradiometers can be considered to represent the convolution of the spatial components of the field along the path of the platform carrying the gradiometers with the doublets corresponding to the gradiometers. The equivalent dipole effect is shown in FIG. 3B. Hence, an additional convolutional filtering operation on the output of each gradiometer may be performed to modify its spatial response function. Since convolution with the doublet represents an approximate differentiation, the filter function should be chosen to be the integral of the desired spatial response.

Since the achievable responses are members of the family of functions resulting from the convolution of a doublet and some finite length function they will have zero net area. Hence, it is advantageous to structure the spatial response to have a narrow peak and to distribute the corresponding negative area over a wide extent. One such response and the corresponding filter function is shown by the pair of graphs 50 in FIG. 4. The detailed shape of this function is only slightly dependent on the doublet separation, as is shown by the graph 60 in FIG. 5. This provides a high degree of rejection of sensor rotation effects in the primary terms to be measured.

It now remains to determine the effects of cross terms which enter when the x', y', z' system is not precisely aligned with the x, y, z system. For convenience, the response function will be referred to by R and the filter function will be referred to as F. The doublet corresponding to gradiometer sense coil separation is absorbed into the convolution only for separations along the direction of motion. Hence these terms appear as field components convolved with R while the remaining terms enter as gradients convolved with F where the variable of integration of the convolutions corresponds to distance along the path of motion. The distance scale of the response function 52, FIG. 4, corresponds to the time scale of the filters multiplied by the platform velocity.

Rewriting equations (2), (3), and (4) in terms of the outputs after filtering by function F and using an asterisk (*) to denote convolution, the following equations are obtained.

Filtered x' gradiometer output =
$(Gx_x\lambda_1\lambda_2 + Gy_x\lambda_1\lambda_2 + Gz_x\nu_1\lambda_2 + Gx_z\lambda_1\nu_2 + Gy_z\mu_1\nu_2 + Gz_z\nu_1\nu_2)*F + (x\lambda_1\mu_2 + y\mu_1\mu_2 + z\nu_1\nu_2)*R$ (5)

Filtered y' gradiometer output =

$$(Gx_x\lambda_2{}^2 + Gy_x\mu_2\lambda_2 + Gz_x\nu_2\lambda_2 + Gx_z\lambda_2\nu_2 + Gy_z\mu_2\nu_2 + Gz_z\nu_2{}^2)^*F + (x\lambda_2\nu_2 + y\mu_2{}^2 + z\mu_2\nu_2)^*R \quad (6)$$

Filtered z' gradiometer output =
$$(Gx_x\lambda_3\lambda_2 + Gy_x\mu_3\lambda_2 + Gz_x\nu_3\lambda_2 + Gx_z\lambda_3\nu_2 + Gy_z\mu_3\nu_2 + Gz_z\nu_1\nu_2)^*F + (x\lambda_3\mu_2 + y\mu_3\mu_3 + z\nu_3\mu_2)^*R \quad (7)$$

If it now be assumed that the x', y', z' frame is approximately aligned with the x, y, z frame, the following approximation with respect to the direction cosine matrix may be made:

$$\begin{bmatrix} \lambda_1 & \mu_1 & \nu_1 \\ \lambda_2 & \mu_2 & \nu_2 \\ \lambda_3 & \mu_3 & \nu_3 \end{bmatrix} \text{ by } \begin{bmatrix} 1 & \epsilon & \epsilon \\ \epsilon & 1 & \epsilon \\ \epsilon & \epsilon & 1 \end{bmatrix}$$

In the right-hand matrix $\epsilon$ denotes a quantity small compared to 1 but not necessarily infinitesimal.

To identify the significant terms, equations (5), (6), and (7) may be rewritten as equations (8), (9), and (10).

Filtered x' gradiometer output =
$$(Gx_x\epsilon + Gy_x\epsilon^2 + Gz_x\epsilon^2 + Gx_z\epsilon + Gy_z\epsilon^2 + Gz_z\epsilon^2)^*F + (x + y\epsilon + z\epsilon)^*R \quad (8)$$

Filtered y' gradiometer output =
$$(Gx_x\epsilon^2 + Gy_x\epsilon + Gz_x\epsilon^2 + Gx_z\epsilon^2 + Gy_z\epsilon + Gz_z\epsilon^2)^*F + (x\epsilon + y + z\epsilon)^*R \quad (9)$$

Filtered z' gradiometer output =
$$(Gx_x\epsilon^2 + Gy_x\epsilon^2 + Gz_x\epsilon + Gx_z\epsilon^2 + Gy_z\epsilon^2 + Gz_z\epsilon)^*F + (x\epsilon + y\epsilon + z)^*R \quad (10)$$

If the axes of the x', y', z' frame are within $\pm 5°$ of the corresponding axes of x, y, z frame, $\epsilon$ will be $<0.1$ and $\epsilon^2 < 0.01$. Gradient terms will be quite small compared to field terms and are of at least first order in $\epsilon$ in equations (8), (9), and (10).

If equations (8), (9) and (10) are squared and added, dropping gradient terms and field terms that are of second or greater order in $\epsilon$, the following equation is obtained, after rearranging terms and identifying first-order terms in $\epsilon$ with their corresponding direction cosines:

Sums of squares of filter outputs =
$$(x^*R)^2 + (y^*R)^2 + (z^*R)^2 + (x^*R)(y^*R)[\mu_1 + \lambda_2] + (x^*R)(z^*R)[\nu_1 + \lambda_3] + (y^*R)(z^*R)[\nu_2 + \mu_3] \quad (11)$$

The first line on the right side of equation (11) corresponds to the square of the desired estimate. The remaining terms correspond to distortion due to cross components introduced by the misalignment of the x', y', z' frame with respect to the x, y, z frame. These are the terms that were of first order in $\epsilon$. Close examination of the pairs of direction cosines in square brackets in equation (11), however shows them to be symmetric about the main diagonal of the original direction cosine matrix. For small misalignments of the two frames, this matrix will be approximately antisymmetric and these terms can be considered to be of second order in $\epsilon$. Hence, for alignment errors of 5° or less the distortion terms will be roughly 40 dB down.

A typical implementation 70 of this invention is shown in FIG. 6. The apparatus 70 is used for measuring the spatial variation of a magnetic field along a path of motion of the apparatus. It is assumed that the magnetic field has the coordinates x, y, and z with respect to a fixed, geographic, frame of reference. The platform is assumed to define another set of orthogonal axes, x', y' and z', the two sets of axes being substantially parallel. Only as a matter of convenience, the motion of the platform is considered to be in the y' direction.

Still referring to FIG. 6, therein is shown an apparatus 70 comprising three means for measuring the gradient of a magnetic field, the means generally being gradiometers. The three gradiometers are labelled 72-x', 72-y' and 72-z'. These gradiometers would be oriented upon the movable platform along the mutually orthogonal axes, x', y' and z'.

As is shown in the figure, the outputs of the three gradiometers 72 are $Gx'_{y'}$, $Gy'_{y'}$ and $Gz'_{y'}$, of the magnetic field when the motion is considered to be in the y' direction.

Three means for filtering 74 each have an input connected to the output of one of the gradiometers 72. The filters 74 have parameters such that their output signal as a function of the magnetic field component along the corresponding gradiometer axis is a relatively narrow positive peak with a relatively wide negative area on each side of the peak, the net area being approximately equal to zero.

Three means for squaring, each having an input connected to the output of the filtering means 74, square their input signals.

A means for summing 78, having three inputs connected to the outputs of the squaring means 76, obtains the sum of the squares of the components x', y' and z' of the magnetic field.

A means 82, whose input is connected to the output of the summing means 78, takes the square root of its input signal, and has as an output the high-pass filtered estimate of the spatial variation of the magnitude of the magnetic field along the y' direction, which is substantially the direction in which the platform is moving.

A variety of implementations is possible for the filters 74, FIG. 6. One convenient implementation for the filter functions of FIGS. 4 and 5 is shown in FIG. 7.

Referring now to FIG. 7, therein is shown one possible implementation 90 of each of the filters 74 shown in FIG. 6.

A first means for delaying 92, whose input is connected to the output of a gradiometer 72, delays its input signal by an interval equal to $\tau/2$, where $\tau$ equals the time delay of the filter 90. A second means for delaying 93, substantially identical to the first delaying means 92, has its input connected to the output of the first means for delaying 92.

A first means for subtracting 94 has two inputs, one connected to the input of the first means for delaying 92, the other input being connected to the output of the second means for delaying 93. The subtracting means subtracts any signal at the second input, at the output of delaying means 93, from the signal at the first input, the input to delaying means 92.

A first means for amplifying 96, whose input is connected to the output of the first subtracting means 94, amplifies its input signal by a factor of $2A/\tau$, where A is the gain, or scale factor, of the filter 90 indicated as the peak value of the filter in FIG. 4.

A first means for integrating 98, whose input is connected to the output of the first multiplying means 96, integrates its input signal.

A second means for amplifying 102, whose input is connected to the junction of the first and second delaying means, 92 and 93, amplifies its input signal by a factor of 2A.

A second means for subtracting 104 has two inputs, one connected to the output of the first integrating means 98 and the other connected to the output of the second amplifying means 102. As is shown in the figure, a signal received from amplifier 102 is subtracted from a signal received from integrating means 98.

A second means for integrating 106, has its input connected to the output of the second subtracting means 104.

The implementation 90 shown in FIG. 7 is particularly suitable for use with digital circuitry. The first and second delaying means, 92 and 93, may comprise shift registers. The means for summing 94 and the first and second integrating means, 98 and 106, may be implemented in the form of digital accumulators.

Other vector magnetometers as well as SQUID devices may be used in the apparatus 70, FIG. 6, of this invention.

The response functions which can be achieved include a very wide class of functions. A basic building block which can be used to construct arbitrary finite-length symmetric zero-area response functions is shown by the set of graphs 110 in FIG. 8. To use this approach one need merely superimpose varying length basic response functions to realize the desired response and then use the same superposition of the basic functions to determine the required filter.

An alternative implementation of suitable filters would involve the use of charge transfer devices.

An additional useful building block which can be used for magnetometers which do not have an inherent offset is shown by the graphs 120 in FIG. 9. These graphs indicate the manner in which a long baseline gradiometer may be synthesized from a short baseline gradiometer. These graphs also provide a building block for zero-area antisymmetric functions. Together these two building blocks permit realization of a wide class of responses.

This design approach can also be used to select filter functions for total field magnetometers for the special case in which only two sensors are used.

Summarizing the main features of the invention, herein are described the use of high-sensitivity vector magnetometers such as SQUIDs on a moderately stable moving base. A wide variety of desirable system spatial responses can be achieved which permit a low distortion estimate of the spatial structure of magnetic field strength along the path traveled by the apparatus. Susceptibility to errors induced by temporal fluctuations of background noise fields and by small rotations of the magnetometers are reduced to that of a conventional short baseline gradiometer.

A key feature of this invention is the use of convolutional post processing to derive field variation data from gradients measured along the direction of motion of the instruments. This results in the sensitivity and response function of a direct field variation measurement while retaining the noise rejection of a gradient measurement.

Obviously, many modifications and variations of the present invention are possible in the light of the above teachings, and, it is therefore understood that within the scope of the disclosed inventive concept, the invention may be practiced therwise than specifically described.

What is claimed is:
1. An apparatus for measuring the spatial variation of magnetic field, along a path of motion of the apparatus, the magnetic field having the coordinates x, y and z with respect to a fixed frame of reference, the apparatus, when in use, generally being mounted on a movable platform, the platform defining another set of orthogonal axes, x', y' and z', the two sets of axes being substantially parallel, the apparatus comprising:
   three means for measuring the gradient of a magnetic field, the means being oriented along the mutually orthogonal axes, x', y' and z' on the platform, the direction of motion being such that the angles between corresponding axes, for example between axes y and y', are within predetermined limits, the outputs of the gradiometers comprising the gradients $Gx'_{y'}$, $Gy'_{y'}$ and $Gz'_{y'}$ of the magnetic field when the motion is considered to be in the y' direction;
   three means for filtering, each means having an input connected to the output of one of the means for measuring, the means having a configuration such that its output signal for a doublet input is a relatively narrow positive peak with a relatively wide negative area on each side of the peak, the net area approximating zero;
   three means for squaring, each having an input connected to the output of a means for filtering, for squaring their input signals;
   a means for summing, having three inputs connected to the outputs of the means for squaring, for obtaining the sum of the squares of the components x', y' and z' of the magnetic field when the platform is moving in the y direction; and
   means, whose input is connected to the output of the means for summing, which takes the square root of its input signal, and has as an output the variation of the magnitude of the magnetic field along the y' direction, which is substantially the direction in which the platform is moving.

2. The apparatus according to claim 1 wherein:
   the means for measuring the gradients of the magnetic field are gradiometers.

3. The apparatus according to claim 2, wherein each means for filtering comprises:
   a first means for delaying, whose input is connected to the output of a gradiometer, for delaying its input signal by an interval equal to $\tau/2$, where $\tau$ equals the time delay of the filter;
   a second means for delaying, substantially identical to the first means for delaying, whose input is connected to the output of the first means;
   a first means for subtracting, having two inputs, one connected to the input of the first means for delaying, the other input being connected to the output of the second means for delaying, the subtracting means subtracting any signal at the second input from that at the first input;
   a first means for amplifying, whose input is connected to the output of the first subtracting means, for amplifying its input signal by a factor of $2A/\tau$, where A is a scale factor describing the peak response of the filter to a single unit impulse;
   a first means for integrating, whose input is connected to the output of the first multiplying means, for integrating its input signal;
   a second means for amplifying, whose input is connected to the junction of the first and second delaying means, for amplifying its input signal by a factor of 2A;

a second means for subtracting, having two inputs, one connected to the output of the first integrating means and the other connected to the output of the second amplifying means, a signal received at the latter input being subtracted from a signal at the first-named input; and a second means for integrating, whose input is connected to the output of the second subtracting means and whose output is the filter output.

4. The apparatus according to claim 3 wherein:
the first and second means for delaying comprise parallel shift registers.

5. The apparatus according to claim 3 wherein:
the means for summing comprises an accumulator.

6. The apparatus according to claim 3 wherein:
the first and second means for filtering are charge-coupled devices.

7. The apparatus according to claim 4 wherein:
the means for summing comprises an accumulator.

* * * * *